United States Patent
Oka et al.

(10) Patent No.: US 7,432,468 B2
(45) Date of Patent: Oct. 7, 2008

(54) PLASMA PROCESSING APPARATUS AND PLASMA PROCESSING METHOD

(75) Inventors: Shinsuke Oka, Kanagawa (JP);
Takahiro Horiguchi, Kanagawa (JP);
Kazuaki Nishimura, Kanagawa (JP);
Masayuki Kitamura, Kanagawa (JP);
Tadahiro Ohmi, Miyagi (JP); Masaki Hirayama, Miyagi (JP)

(73) Assignees: Tokyo Electron Limited, Tokyo (JP); Tohoku University, Sendai-shi (JP)

( * ) Notice: Subject to any disclaimer, the term of this patent is extended or adjusted under 35 U.S.C. 154(b) by 0 days.

(21) Appl. No.: 11/694,102

(22) Filed: Mar. 30, 2007

(65) Prior Publication Data
US 2007/0235425 A1   Oct. 11, 2007

(30) Foreign Application Priority Data
Mar. 30, 2006   (JP)   ............................. 2006-095897

(51) Int. Cl.
*B23K 10/00*   (2006.01)
(52) U.S. Cl. ............................. 219/121.43; 219/121.44; 219/121.48; 156/345.36; 315/111.81; 204/298.38
(58) Field of Classification Search ............... 219/121.4, 219/121.41, 121.43, 121.44, 121.48, 121.59; 118/723 MW; 315/111.51, 111.81; 156/345.36; 204/298.37, 298.38
See application file for complete search history.

(56) References Cited

U.S. PATENT DOCUMENTS

| 6,830,652 B1 * | 12/2004 | Ohmi et al. ............ 156/345.41 |
| 2004/0221809 A1 * | 11/2004 | Ohmi et al. ................. 118/715 |
| 2005/0205015 A1 * | 9/2005 | Sasaki et al. ......... 118/723 MA |

OTHER PUBLICATIONS

"Microwave Plasma Technologies", compiled by the Microwave Plasma Research Specialists' Committee, Electric Science Conference, published by Ohm Publishing Company on Sep. 25, 2003 (with Partial English Translation), 5 pages.

* cited by examiner

*Primary Examiner*—Mark H Paschall
(74) *Attorney, Agent, or Firm*—Oblon, Spivak, McClelland, Maier & Neustadt, P.C.

(57)   ABSTRACT

A microwave plasma processing apparatus 100 allows microwaves, passed through a plurality of slots 37, to be transmitted through a plurality of dielectric parts 31 supported by beams 26, raises a gas to plasma with the transmitted microwaves and processes a substrate G with the plasma. The beams 26 are made to project out toward the substrate so as to ensure that the plasma electron density Ne around the ends of the beams 26 is equal to or greater than a cutoff plasma electron density Nc. The projecting beams 26 inhibits interference attributable to surface waves generated with the electrical field energy of microwaves transmitted through adjacent dielectric parts 31 and interference attributable to electrons and ions propagated through the plasma generated under a given dielectric part 31 to reach the plasma generated under an adjacent dielectric part as the plasma generated under the individual dielectric parts 31 is diffused.

14 Claims, 8 Drawing Sheets

| BEAM HEIGHT (mm) | FIXED ELECTRICAL CHARGE DENSITY (cm$^{-2}$) | VISUAL OBSERVATION |
|---|---|---|
| 0 | 2.7 | ○ |
| 10 | 1.8 | × |
| 20 | 1.3 | × |

PLASMA PROCESSING APPARATUS AND PLASMA PROCESSING METHOD

CROSS REFERENCE TO RELATED APPLICATION

The present invention contains subject matter related to Japanese Patent Application No. JP 2006-095897 filed in the Japan Patent Office on Mar. 30, 2006, the entire contents of which are incorporated herein by reference.

BACKGROUND OF THE INVENTION

1. Field of the Invention

The present invention relates to a plasma processing apparatus that generates plasma and processes a subject to be processed with the plasma and a plasma processing method to be adopted in the plasma processing apparatus.

2. Description of the Related Art

It has been known in the related art that if the power of incoming microwaves changes while generating plasma through microwave discharge, surface waves in an inherent mode may be excited discontinuously depending upon the extent of the power changes or the processing conditions, as shown in FIG. 10. If a surface wave mode is excited discontinuously as described above, plasma electron density jumps (mode jumps) occur, whereby the electron density of the plasma generated under a dielectric member changes discontinuously.

SUMMARY OF THE INVENTION

If such a mode jump occurs frequently during plasma generation, optimal plasma processing cannot be executed. For instance, if mode jumps occur frequently during a CVD (chemical vapor deposition) process, the state of the plasma changes discontinuously each time a mode jump occurs and this causes a fluctuation in the extent of gas dissociation and a change in the quality of the film being formed. As a result, non-uniform films become layered one on top of another.

Accordingly, it is an aspect of the invention to provide a new and improved plasma processing apparatus and a new and improved plasma processing method, with which the occurrence of plasma mode jumps can be inhibited effectively.

As explained above, the fluctuation in the electrical field energy of the incoming microwaves is considered to be a factor that causes plasma mode jump during plasma generation. The electrical field energy fluctuation occurs as the amplitude of advancing waves being propagated through a waveguide and the amplitude of reflected waves resulting from reflection of the advancing waves at an end surface of the waveguide both change constantly over time and thus, the amplitude of standing waves inside the waveguide, which are constituted of a combination of the advancing waves and the reflected waves, also constantly changes.

Another conceivable cause for mode jump is a change in the plasma density resulting from a change in the impedance in the plasma occurring as the electrical field energy of the microwaves fluctuates as described above, which alters the ratio of the electrical field energy of the surface waves that is absorbed in the plasma and the electrical field energy that is reflected by the plasma while the surface waves are propagated between the dielectric member and the plasma.

If the dielectric member included in the plasma processing apparatus is constituted with a plurality of dielectric parts separated from one another via a beam, plasma is generated in the vicinity of the lower surface of each dielectric part. In this plasma processing apparatus, surface waves will be generated at the individual dielectric parts with the electrical field energy of the microwaves transmitted through the dielectric parts and a mode jump may be induced by interference in the plasma generated under a given dielectric part by the surface waves transmitted through an adjacent dielectric part. Furthermore, as the plasma generated under the various dielectric parts is diffused, electrons and ions contained in the diffused plasma, having been generated under a given dielectric part may interfere with the plasma from an adjacent dielectric part, and this interference, too, is considered to be a cause of mode jump. In reality, plasma mode jump occurs as a result of these combined factors "interacting with one another in a complex manner" and inducing fluctuations discontinuously in the density of the plasma generated under the individual dielectric parts.

According to one embodiment of the present invention, the occurrence of such mode jump is inhibited by providing a plasma processing apparatus including a plurality of waveguides each having a plurality of slots, a dielectric member through which microwaves propagated via the plurality of waveguides and via the plurality of slots are transmitted, and a processing chamber in which a gas is raised to plasma by the microwaves transmitted through the dielectric member and a subject to be processed is processed with the plasma, wherein:

the dielectric member is constituted with a plurality of dielectric parts that are supported by a beam, each of the plurality of dielectric parts transmitting the microwaves propagated through one or more of the plurality of waveguides and passed thereto via one or more slots in each of the waveguides; and wherein the beam projects from the bottom surface of the dielectric parts toward the subject to be processed to the extent that an electron density Ne of the plasma in the vicinity of an edge of the projected beam becomes equal to or greater than a cutoff electron density Nc of the plasma.

The each of the plurality of dielectric parts may be supported by the beam over peripheral edges of the dielectric part.

Surface waves generated by the electrical field energy at the lower surface of each dielectric part are propagated as they are reflected between the surface of the dielectric parts and the beam and the plasma. During this process, part of the electrical field energy of the surface waves is used as so-called evanescent waves for the plasma generation. Generally speaking, In the case that no energy is supplied from the outside, the electrical field energy of the surface waves used in the plasma generation increases in proportion to the surface wave propagation distance.

In the case that a beam constituted of a nonmagnetic electrically conductive material, the beam does not allow microwaves to be transmitted. In such a case, no additional electrical field energy can be received as the surface waves are propagated over the beam surface. If the heights of the dielectric parts and the beam are not same grade level (see FIG. 4), the distance over which the surface waves are propagated to the plasma generated under an adjacent dielectric part is extended compared to the distance in the case that the heights of the dielectric part and the beam are same grade level (the beam does not project out) (see FIG. 7) by an extent corresponding to the portion of the beam constituting its sidewall, and furthermore, no electrical field energy can be applied to the surface waves being propagated over the beam. For this reason, a great deal of electrical field energy is consumed while the surface waves are propagated toward an adjacent dielectric part and the surface wave becomes attenuated before it reaches the lower portion of the adjacent dielectric part. Thus, the surface wave is not allowed to interfere with the plasma generated under the adjacent dielectric part.

In addition, as the area of the surface of the beam wall increases by allowing the beam to project out, the electrons and the ions to collide with the wall surface increase exponentially (the coefficients of electron diffusion and ion diffusion can be each expressed as an exponential function) and, as a result, the numbers of electrons and ions propagated to the plasma generated under the adjacent dielectric part decrease. Consequently, interference in the plasma generated under the adjacent dielectric part by the diffused plasma can be inhibited.

As explained above, in the plasma processing apparatus according to the present invention since the presence of the projecting beam inhibits the interference by the surface wave and the interference by the diffused plasma and thus plasma mode jump is effectively inhibited, thereby, uniform plasma can be generated in a stable manner.

In the plasma processing apparatus according to the present invention, the beam is made to project out by a specific extent so as to ensure that the plasma electron density Ne around the end of the beam toward the subject to be processed is equal to or greater than the cutoff plasma electron density Nc. In other words, when the beam is made to project out to the position corresponding to its upper limit value he, the plasma electron density Ne over an area around the end of the beam toward the subject to be processed is equal to the cutoff plasma electron density Nc. More specifically, the upper limit value hc of the projected position of beam can be expressed as $hc = 2^{1/2} \times a \times (1 - nNo - 1nNc)/2\pi$, with 'No' representing the plasma electron density in the vicinity of the dielectric part and 'a' representing the smallest value of the interval between adjacent beams, and in reality, he is approximately 0.038 m. It is to be noted that the area around the end of the beam toward the subject to be processed refers to a location distanced from the end of the beam by at least approximately several millimeters to 1 cm toward the subject to be processed.

As explained earlier, the surface wave generated with the electrical field energy at the lower surface of each dielectric part is propagated as it is reflected between the surface of the dielectric part and the beam and the plasma. During this process, part of the electrical field energy in the surface wave is used as an evanescent wave in the plasma generation. Since no energy is supplied from the outside while the microwaves are propagated around the conductive beams, the electrical field energy in the surface wave is continuously used up for plasma generation and, as a result, the surface wave becomes attenuated.

It is assumed that No (see FIG. 3) represents the plasma electron density near the dielectric member, that Ne represents the plasma electron density near the beam ends and that Nc (see FIG. 3) represents the cutoff plasma electron density. As the surface wave becomes attenuated as described above and the plasma electron density Ne near the beam ends become smaller than the cutoff plasma electron density Nc, it is no longer possible to sustain a state in which the surface wave (microwave) propagating over the beams penetrates in the plasma as an evanescent wave due to the lowered electron density around the beam ends and instead, the surface wave advances into the plasma rapidly. As a result, the plasma inside the processing container becomes destabilized.

However, in the plasma processing apparatus according to the present invention, the beams a re made to project out to such an extent that the plasma electron density Ne near the beam ends is equal to or greater than the cutoff plasma electron density Nc. Namely, the upper limit value he set with regard to the beam projection assumes a value expressed as $2^{1/2} \times a \times (1 - nNo - 1nNc)/2\pi$, i.e., approximately 0.038 m obtained through simulation. The plasma electron density near the ends of such projecting beams is sustained at a specific level and the density never becomes extremely small. Thus, destabilization of the plasma inside the processing container, caused by the surface wave (microwave) propagating through the beam enters the processing container through the plasma rapidly, can be inhibited. As a result, a substrate can be processed with a high level of accuracy with the uniform plasma.

At least any one of a recessed portion and a projecting portion may be formed at a surface of the each of the plurality of the dielectric parts, which surface faces the subject to be processed. The presence of the recessed portion or the projecting portion at each dielectric part increases the extent of the electrical field energy loss occurring as a surface wave is propagated at the lower surface of the dielectric part. Thus, uniform plasma can be generated by inhibiting propagation of the surface wave and thus inhibiting the occurrence of a standing wave.

The plasma processing apparatus may include a first gas supply unit that supplies a first gas through first gas supply holes; and a second gas supply unit that supplies a second gas through second gas supply holes formed further toward the subject to be processed than the first gas supply holes, wherein: the beam is disposed further toward the dielectric member than the second gas supply holes. In such a plasma processing apparatus, the beams may be disposed further toward the dielectric member than the second gas supply holes. The beams disposed further toward the dielectric member than the second gas supply hole in this positional arrangement, do not inhibit the diffusion of the plasma toward the subject to be processed.

It is preferable that the binding energy of the first gas is greater than the binding energy of the second gas.

In the plasma processing apparatus, the first gas with the greater binding energy is raised to plasma with the intense electrical field energy of the microwaves having just introduced the processing chamber. The second gas with the smaller binding energy is dissociated to an optimal extent until it becomes a precursor for forming a good-quality film with the electrical field energy, the intensity of which has been reduced as some energy has been expended to raise the first gas to plasma. The second gas may be "dissociated to an optimal extent" when, for instance, a silane (SiH4) gas is dissociated to an SiH3 radical state but is not overly dissociated to an SiH2 radical state. Thus, the subject to be processed can be accurately plasma-processed by using plasma having been dissociated to an optimal extent and having become radially and evenly diffused.

It is to be noted that under a special set of circumstances, e.g., when at least any one of the first gas and the second gas is a mixed gas containing a plurality of types of gas constituents and this mixed gas induces an excessive reaction, the gas supply positions at which the first gas and the second gas are introduced should be determined by ensuring that no excessive reaction occurs, regardless of the binding energy levels of the first gas and the second gas. It is also to be noted that the first gas and the second gas may be used to excite plasma or they may be used as processing gases in oxidation processing, nitride processing, etching, CVD processing or the like.

The beams may be formed by using an electrically conductive material. By inhibiting propagation of the microwaves between adjacent dielectric parts with such beams, even more stable and uniform plasma can be excited. In addition, the beams may be formed by using a non-magnetic material. Since the beams do not become magnetized and thus no magnetic field is generated from the beams to adversely affect the plasma and generation of uneven plasma can be inhibited.

According to another embodiment of the present invention by providing a plasma processing method to be adopted in a plasma processing apparatus steps of, propagating microwaves through one or more waveguides of a plurality of waveguides, passing the microwaves through one or more slots of a plurality of slots at each waveguide, transmitting the microwaves through a plurality of dielectric parts supported by a beam formed to project from the bottom surface of the dielectric parts toward the subject to be processed to the extent that an electron density Ne of the plasma in the vicinity of an edge of the projected beam becomes equal to or greater than a cutoff electron density Nc of the plasma, and processing the subject to be processed with plasma generated by raising a gas with the transmitted microwaves.

The stage created between the beam and the dielectric part lengthens the distance over which a surface wave traveling through the dielectric part to reach the plasma generated under an adjacent dielectric part by an extent corresponding to the portion of the beam constituting its sidewall. As long as there is no energy supplied from the outside, the electrical field energy of the surface wave used for plasma generation increases in proportion to the distance over which the surface wave is propagated. No electrical field energy can be applied to the surface wave being propagated over the beam constituted of a nonmagnetic, electrically conductive material. For this reason, a great deal of electrical field energy is used up as the surface wave propagated over the beam and the surface wave becomes attenuated before it reaches the space under the adjacent dielectric part. As a result, the surface wave does not interfere with the plasma generated under the adjacent dielectric part. Furthermore, since the beams are made to project out to a position at which they do not form a barrier that would block the plasma being diffused onto the subject to be processed, the diffused plasma is allowed to spread evenly and radially over the subject to be processed, instead of being blocked by the beams, in the plasma processing apparatus according to the present invention.

Additionally, in the present invention the beams are made to project out to such an extent that the plasma electron density Ne near the beam ends is equal to or greater than the cutoff plasma electron density Nc. Namely, the upper limit value he set with regard to the beam projection assumes a value expressed as $2^{1/2} \times a \times (\ln No - \ln Nc)/2\pi$, (i.e., approximately 0.038 m obtained through simulation). The plasma electron density near the end of such a projecting beam is sustained at a specific level and the density never becomes extremely small. Thus, destabilization of the plasma inside the processing container, caused by the surface wave (microwave) propagating through the beam and advancing into the plasma rapidly instead of penetrating the plasma as an evanescent wave, can be inhibited. As a result, a substrate can be processed with a high level of accuracy by using the uniform plasma.

In addition, when stage is created between each dielectric part and the supporting beam the electrons and the ions to collide with the beam wall surface increase exponentially and, as a result, the numbers of electrons and ions propagated to the plasma generated under the adjacent dielectric part decrease. Consequently, interference in the plasma generated under the adjacent dielectric part by the diffused plasma can be inhibited. Therefore, by inhibiting the interference by the surface wave and the interference by the diffused plasma and thus inhibiting plasma mode jump, uniform plasma can be generated in a stable manner.

The plasma processing method described above may include steps of introducing a first gas through first gas supply holes; and introducing a second gas through second gas supply holes formed further toward the subject to be processed than the first gas supply holes and the projected position of the beam after plasma ignition of the introduced first gas. In addition, it is preferable that at least any one of the first gas and the second gas is a mixed gas containing a plurality of gas constituents; and the first gas and the second gas have a relationship whereby a binding energy of the first gas is greater than a binding energy of the second gas.

In the plasma processing method, the first gas with the greater binding energy is first raised to plasma with the intense electrical field energy of the microwaves having just introduced the processing chamber. Then, following the plasma ignition of the first gas, the second gas with the smaller binding energy compared to the first gas is introduced through the second gas supply holes formed further toward the subject to be processed than the first gas supply hole and the position to which the beam are made to project out. Thus, the second gas becomes dissociated until it becomes a precursor for forming a good-quality film with the electrical field energy of the microwaves having become less intense after significant power has been used to raise the first gas to plasma. Since the second gas supply holes are set further toward the subject to be processed than the first gas supply holes and the position to which the beams are made to project out, the diffusion of the plasma moving toward the subject to be processed is not inhibited by the presence of the first gas supply holes or the beams. Consequently, the subject to be processed can be plasma processed with a high level of accuracy by using the plasma evenly generated over the subject to be processed.

It is to be noted that under a special set of circumstances, e.g., when at least any one of the first gas and the second gas is a mixed gas containing a plurality of types of gas constituents and this mixed gas induces an excessive reaction, the gas supply positions at which the first gas and the second gas are introduced should be determined by ensuring that no excessive reaction occurs, regardless of the binding energy levels of the first gas and the second gas.

As explained above, the present invention provides a new and improved plasma processing apparatus and a new and improved plasma processing method, with which a plasma mode jump can be inhibited effectively.

DETAILED DESCRIPTION OF THE EMBODIMENT

Hereinafter, preferred embodiments of the present invention will be described in detail with reference to the appended drawings. Note that, in this specification and the appended drawings, structural elements that have substantially the same function and structure are denoted with the same references, and repeated explanation of these structural elements is omitted.

In addition, the description in the specification is provided by assuming that 1 mTorr is substantially equal to $(10^{-3} \times 101325/760)$ Pa and that 1 sccm is substantially equal to $(10^{-6}/60)$ m³/sec.

Figure 1:
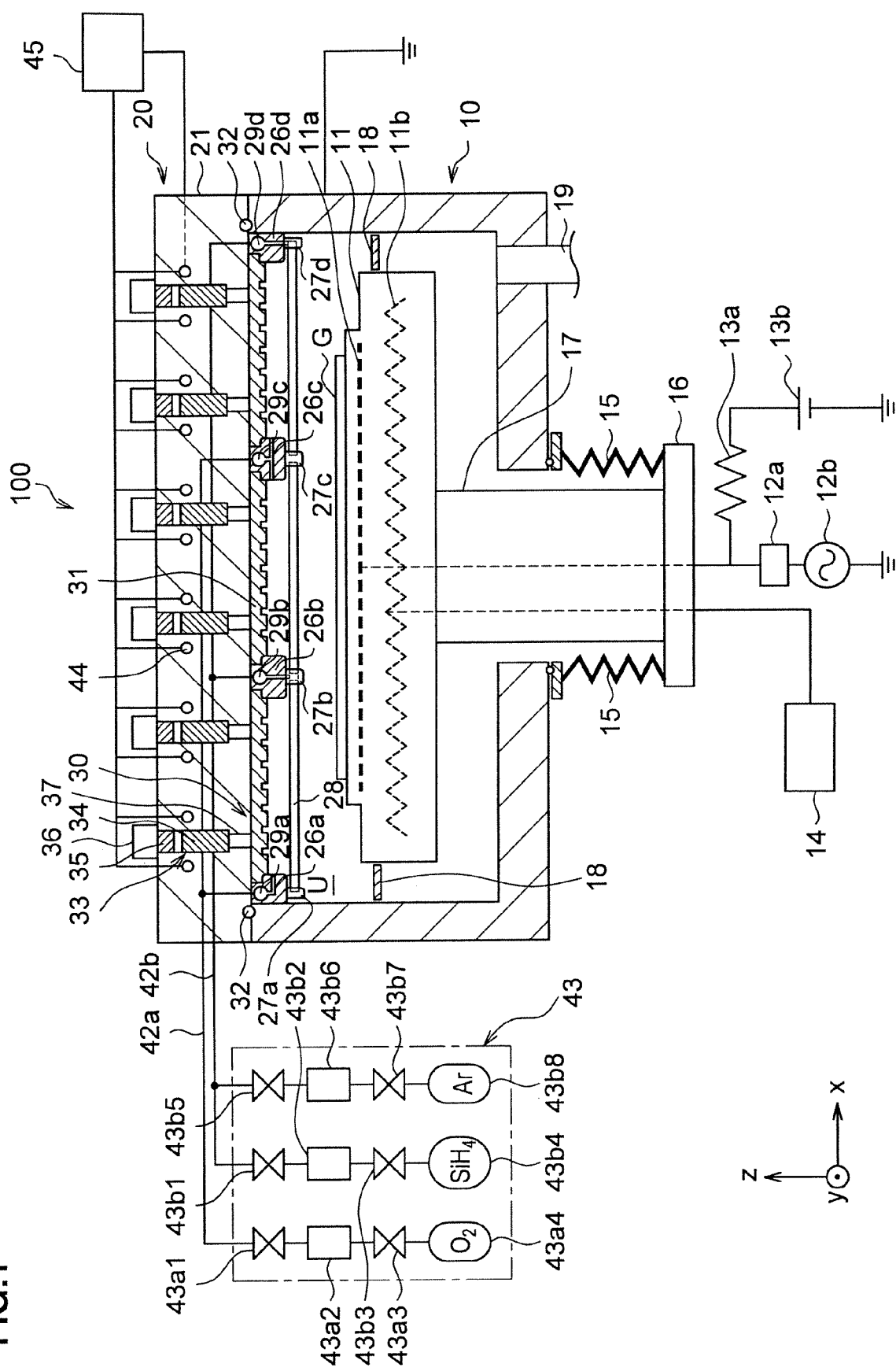
FIG. 1 is a sectional view of the microwave plasma processing apparatus achieved in an embodiment of the present invention.
Figure 2:
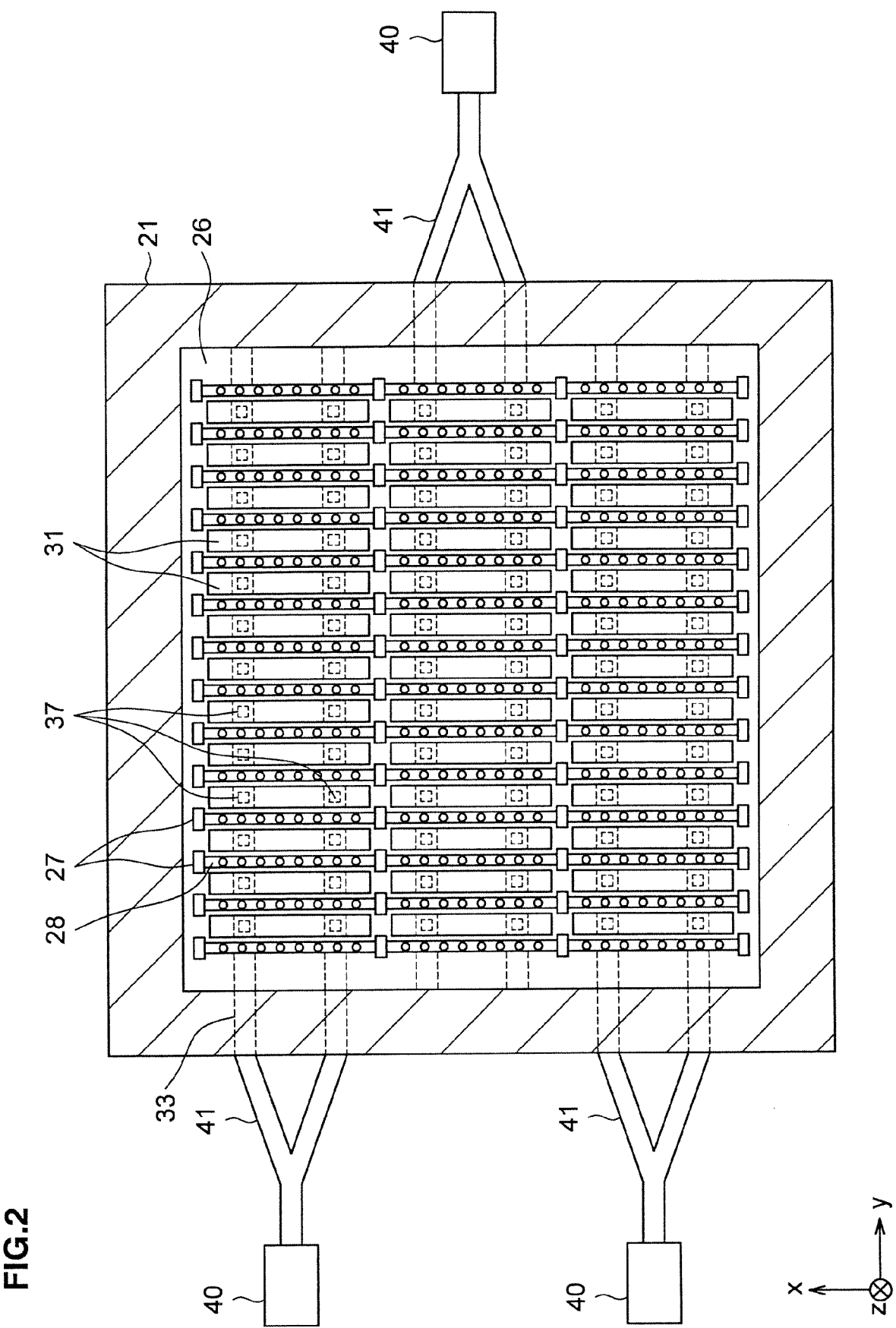
FIG. 2 is a view of the ceiling of the processing container achieved in the embodiment.

First, in reference to FIG. 1 presenting a sectional view of the microwave plasma processing apparatus achieved in an embodiment of the present invention, taken along the longitudinal direction (the direction perpendicular to the y-axis) and FIG. 2 presenting a view of the ceiling of the processing chamber, the structure adopted in the microwave processing apparatus is explained. It is to be noted that the following explanation focuses on a gate oxide film forming process executed in the microwave plasma processing apparatus (one example for the "plasma processing apparatus") achieved in the embodiment.

(Structure of the Microwave Plasma Processing Apparatus)

A microwave plasma processing apparatus 100 includes a processing container 10 and a lid 20. The processing container 10 assumes a rectangular parallelepiped shape with an open top and a solid-bottom. The processing container 10 and the lid 20 are sealed together via an O-ring 32 disposed between the external circumference of the bottom surface of the lid main body 21 and the external circumference of the top surface of the processing container 10, thereby the processing container 10 and the lid 20 are secured so as to keep airtightness in the processing chamber, forming a processing chamber U where plasma processing is executed. The processing container 10 and the lid 20 may be constituted of a metal such as aluminum and are electrically grounded.

Inside the processing container 10, a susceptor 11 (stage) on which a glass substrate (hereinafter referred to as a "substrate") G is placed is disposed. The susceptor 11 is constituted of, for instance, aluminum nitride and a power supply unit 11a and a heater 11b are installed inside the susceptor 11.

A high-frequency power source 12b is connected to the power supply unit 11a via a matcher 12a (e.g., a capacitor). In addition, a high-voltage DC power source 13b is connected to the power supply unit 11a via a coil 13a. The matcher 12a, the high-frequency power source 12b, the coil 13a and the high-voltage DC power source 13b are all disposed outside the processing container 10. The high-frequency power source 12b and the high-voltage DC power source 13b are grounded.

The power supply unit 11a applies a predetermined level of bias voltage into the processing container 10 by using high-frequency power output from the high-frequency power source 12b. In addition, the power supply unit 11a electrostatically adsorbs the substrate G with a DC voltage output from the high-voltage DC power source 13b.

An AC power source 14 disposed outside the processing container 10 is connected to the heater 11b, and the heater 11b thus maintains the temperature of the substrate G at a predetermined level by using an AC voltage output from the AC power source 14.

A cylindrical opening is formed at the bottom surface of the processing container 10, with one end of a bellows 15 attached to the circumferential edge of the opening on the bottom side. The other end of the bellows 15 is fastened to an elevator plate 16. The holes At the bottom surface of the processing container 10 is thus sealed with the bellows 15 and the elevator plate 16.

The susceptor 11, supported at a cylindrical member 17 disposed on the elevator plate 16, moves up and down as one with the elevator plate 16 and the cylindrical member 17, so as to adjust the height of the susceptor 11 at a position optimal for a specific processing operation. In addition, a baffle plate 18 is disposed around the susceptor 11 in order to control the gas flow in the processing chamber U in the optimal state.

A vacuum pump (not shown) disposed outside the processing container 10 is provided near the bottom of the processing container 10. As the gas is exhausted with the vacuum pump from the processing container 10 via a gas exhaust pipe 19, the pressure inside the processing chamber U is lowered until a desired degree of vacuum is achieved.

At the lid 20, the lid main body 21, six rectangular waveguides 33, a slot antenna 30 and a dielectric member constituted with a plurality of dielectric parts 31 are disposed.

The six rectangular waveguides 33 (correspond to the "waveguides") have a rectangular cross-section and are disposed parallel to one another inside the lid main body 21. The space inside each waveguide is filled with a dielectric material 34 such as a fluororesin (e.g., Teflon™), alumina (Al2O3) or quartz. Thus, the guide wavelength λg1 within each rectangular waveguide 33 is controlled as indicated in expression; $\lambda g1 = \lambda c/\epsilon 1)^{1/2}$. $\lambda c$ and $\epsilon 1$ in the expression respectively represent the wavelength in free space and the dielectric constant of the dielectric member 34.

Each of the rectangular waveguides 33 has an open at the upper portion and a movable portion 35 is inserted into the open to be allowed to move up/down freely. The movable portion 35 may be constituted of a nonmagnetic, electrically conductive material such as aluminum.

Outside the lid main body 21, an elevator mechanism 36 is disposed at the upper surface of each movable portion 35 so as to move the movable portion 35 up/down. This structure allows the movable portion 35 to move to a point level with the upper surface of the dielectric material 34 so as to freely adjust the height of the rectangular waveguide 33.

The slot antenna 30, located on the bottom side of the lid main body 21, is formed as an integrated part of the lid main body 21. The slot antenna 30 may be constituted of a nonmagnetic metal such as aluminum. As shown in FIG. 2, 13 slots (openings 37) of the slot antenna 30 are formed in series at the bottom surface of each rectangular waveguide 33. The space inside each slot 37 is filled with a dielectric member constituted of a fluororesin, alumina (Al2O3) or quartz and the dielectric member enables control of the guide wavelength $\lambda g_2$ inside each slot 37, as indicated in expression: $\lambda g_2 = \lambda c/\epsilon_2)^{1/2}$. $\lambda c$ and $\epsilon_2$ in the expression respectively represent the wavelength in free space and the dielectric constant of the dielectric member inside the slot 37.

The dielectric member is constituted with 39 dielectric parts 31. Each of the dielectric parts 31 is formed in the shape of a tile. 13 dielectric parts 31 are disposed in three rows so that each row of dielectric parts ranges over two rectangular waveguides 33 connected to one microwave generator 40 via a Y branch pipe 41.

Each dielectric part 31 is installed so as to range over two slots with y coordinates equal to each other among the 26 (13 slots×2 rows) slots 37 formed at the bottom surfaces of the two adjacent rectangular waveguides 33 (i.e., the two rectangular waveguides 33 connected to each microwave generator 40 via a Y branch pipe 41). The structure described above includes a total of 39 (13×3 rows) dielectric parts 31 mounted at the bottom surface of the slot antenna 30.

Figure 3:
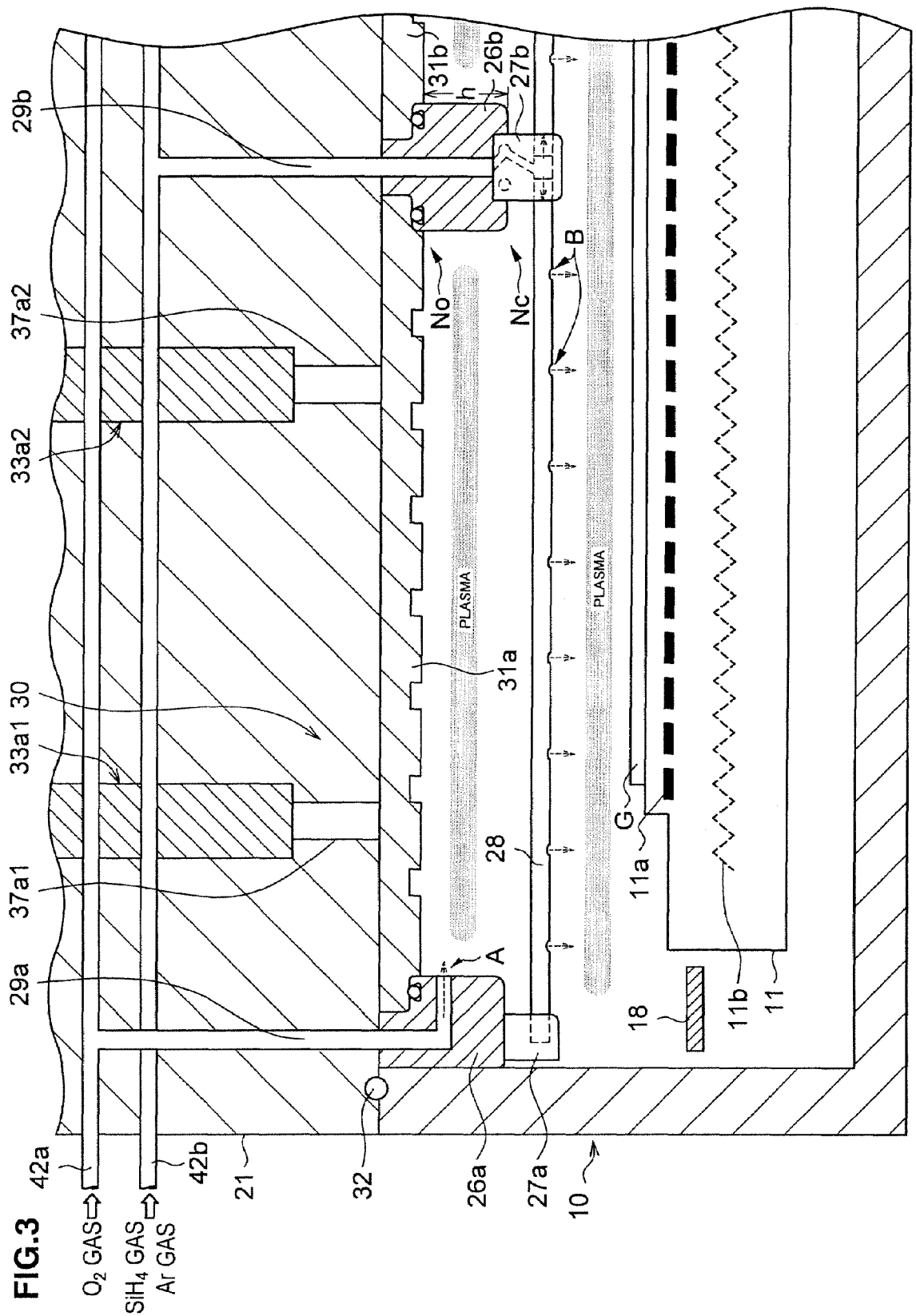
FIG. 3 is an enlarged sectional view of the area near the dielectric member achieved in the embodiment.

Each of dielectric parts 31 is constituted of the dielectric material such as glass quartz, AlN, Al2O3, sapphire, SiN, ceramics. As shown in FIGS. 1 and 3, recessed portions and projecting portions are formed at the surface of each of dielectric parts 31 facing opposite the substrate G. The presence of at least any one of recessed portions and projecting portions formed at the surface of the dielectric parts 31 increases the loss of electrical field energy as the surface wave is propagated over the surface of the dielectric part 31 and thus, the extent of surface wave propagation is suppressed. As a result, the occurrence of a standing wave is inhibited, thereby uniform plasma is generated.

It is to be noted that any number of slots 37 may be formed at the bottom surface of each rectangular waveguide 33. Twelve slots 37, for instance, may be formed at the bottom surface of each rectangular waveguide 33 and a total of 36 (12×3 rows) dielectric parts 31 may be disposed at the bottom surface of the slot antenna 30, instead. In addition, the quantity of slots 37 present at the top surface of each of dielectric parts 31 does not need to be two, and there may be a single slot 37 or three or more slots 37 present at the top surface of each dielectric part 31.

(The Projected Beam)

At the bottom surface of the slot antenna 30, a latticed beam 26 is provided to support 39 dielectric parts 31 disposed over the three rows with 13 dielectric parts 31 set in each row, as shown in FIG. 2. Each dielectric parts 31 is supported by the beam 26 (as shown at beams 26a-26d in FIG. 1) over peripheral edges of the dielectric parts 31 so as to provide the stage between the dielectric parts 31 and the beam 26. Namely, the beam 26 is provided so that the beam 26 projects out toward a glass substrate G at peripheral edges of the each of dielectric parts 31. The beam 26 may be constituted of a nonmagnetic material such as aluminum.

A plurality of the support members 27 (as shown at support members 27a-27d in FIG. 1) is mounted to the part of the beam 26 at the bottom of the beam 26. The both ends of each of gas supply pipes 28 (for instance, parts being one unit of constituting of the lower gas shower head) are supported by the support member 27. The gas supply pipes 28 may be constituted of a dielectric material such as Al2O3.

A cooling water pipes 44 in FIG. 1 is connected with a cooling water supply source 45 installed outside the microwave plasma processing apparatus 100 and as cooling water supplied from a cooling water supply source 45 circulates through the cooling water pipes 44 and returns to the cooling water supply source 45, the temperature at the lid main body 21 is maintained at a desired level.

According to the structure described above, for instance, 2.45 GHz×3 microwaves are output from the three microwave generators 40 in FIG. 2, transmit the dielectric members 31 through slots 37 via rectangular waveguides 33 and Y branch pipes 41 respectively, and are supplied into the processing chamber U.

(A First Gas Supply Unit and a Second Gas Supply Unit)

Next, it is explained about gas supply units related to the microwave plasma processing apparatus of the present embodiment in reference to FIGS. 1 and 3. As shown FIG. 1, a gas supply source 43 is constituted with a plurality of valves (valves 43a1, 43a3, 43b1, 43b3, 43b5 and 43b7), a plurality of mass flow controllers (mass flow controllers 43a2, 43b2 and 43b6), and a oxygen gas supply source 43a4, a silane gas supply source 43b4 and an argon gas supply source 43b8.

The oxygen gas, the silane gas and the argon gas achieving a desired level of concentration, are supplied into the processing container 10 from the gas supply source 43 by individually controlling the open/closed states of valves (the valves 43a1, 43a3, 43b1, 43b3, 43b5 and 43b7) and the degrees of openness of the mass flow controllers (mass flow controllers 43a2, 43b2 and 43b6).

The gas supply pipes 29 as shown at s gas supply pipes 29a-29d in FIG. 1 is extended through inside the beam 26 as shown at the beam 26a-26d in FIG. 1. The gas supply pipes 29a and 29c are connected to the oxygen gas supply source 43a4 via a first passage 42a. The gas supply pipes 29b and 29d are connected to the silane gas supply source 43b4 and the argon gas supply source 43b8 via a second passage 42b.

As shown in FIG. 1 and also shown in FIG. 3 presenting an enlarged sectional view, the oxygen gas is introduced into the space between each of the dielectric parts 31 and the gas pipe 28 through the gas supply holes A as shown in FIG. 3 via the gas supply pipes 29a and 29c. For instance, in FIG. 3, the oxygen gas supplied from the oxygen gas supply source 43a4 is ionized and dissociated by the electrical field energy of the microwaves that transmitted the dielectric parts 31, propagated through the rectangular waveguides 33a1 and 33a2 and passed through the slots 37a1 and 37a2. Thereby, plasma is generated through the oxygen gas.

Meanwhile, following plasma ignition of the oxygen gas, for instance, the mixed gases containing the silane gas and the argon gas are introduced toward the substrate G on the susceptor 11 through the gas supply holes B of each of the gas pipe 28 connected to gas tubes extended through inside the support 27b as shown in FIG. 3 via the gas supply pipes 29b and 29d. Thereby, the mixed gases containing the silane gas and the argon gas are dissociated to SiH3 radicals which constitute a precursor for forming a good-quality film with the electrical field energy, the intensity of which has been reduced as some energy has been expended to raise the oxygen gas to plasma (i.e., the dissociation of the mixed gas does not progress to generation of SiH2 radicals). With the plasma thus generated, a very high-quality gate oxide film can be formed on the substrate G.

Typically, it is preferable that the binding energy of the gas (the first gas) introduced through the upper gas supply holes A is greater than the binding energy of the gas (the second gas) introduced through the lower gas supply holes B (located downwardly than the gas supply holes A).

In this condition, as described above, first, the first gas with the greater binding energy is raised to plasma with the comparatively intense electrical field energy of the microwaves. Then, following the plasma ignition of the supplied gas, the second gas with the smaller binding energy compared to the first gas is introduced through the gas supply holes B formed downwardly than the position to which the beam 26 are made to project out and the gas supply holes A. Thus, the second gas becomes dissociated until it becomes a precursor for forming a good-quality film with the electrical field energy of the microwaves having become less intense after significant power has been used to raise the first gas to plasma. Consequently, a good-quality gate oxide film can be generated over the substrate G.

Based on the above principle, the binding energy with which O molecules are bound together is 5.2 (eV), the binding energy with which Si molecules and H molecules become bound is 3.2 (eV) and the ionization energy of Ar is 15.759 (eV). This means that it may be prefer that an gate oxide film forming process is executed by supplying the argon gas with greater energy than the silane gas or the oxygen gas from the upper side of the processing container and supplying the mixed gas containing the silane gas and the oxygen gas from lower side of the processing container.

However, since an excessive reaction occurs in a mixed gas obtained by mixing silane gas and oxygen gas, the silane gas and the oxygen gas cannot be supplied in mixed form. For this specific reason, the oxygen gas is introduced at the upper level and the silane gas is introduced at the lower level in the microwave plasma processing apparatus 100 in the embodiment. In addition, since the silane gas is introduced at the lower level in a small quantity (more specifically, the silane gas is supplied at 100 sccm relative to the flow rate of the oxygen gas set at 833 sccm), the silane gas flowing at 100 sccm is first mixed with argon gas flowing at 1500 sccm, thereby increasing the overall flow rate of the gas and then this mixed gas is introduced at the lower level. The argon gas in the mixed gas introduced at the lower level induces dissociation, which ultimately helps generate even more uniform plasma.

In addition, the beams 26 in the microwave plasma processing apparatus 100 achieved in the embodiment are made to project out by ensuring that their projected ends are not set lower than the gas supply holes B. In the microwave plasma processing apparatus adopting this structure, the beams 26 do not block diffusion of the plasma, having become dissociated to the desired extent, spreads radially downward toward the substrate G. Thus, a good gate oxide film can be formed on the substrate G with the plasma having become dissociated into SiH3 radicals, i.e., a precursor, instead of having become dissociated to an excessive extent.

It is to be noted that the gas supply unit that introduces the oxygen gas (equivalent to the first gas) supplied thereto through the gas supply holes A (equivalent to the first gas supply hole) is referred to as a first gas supply unit. In addition, the gas supply unit that introduces the mixed gas (containing the silane gas and the argon gas (equivalent to the second gas) and supplied thereto through the gas supply holes B (equivalent to the second gas supply hole) is referred to as the second gas supply unit.

(Plasma Mode Jump)

Figure 4:
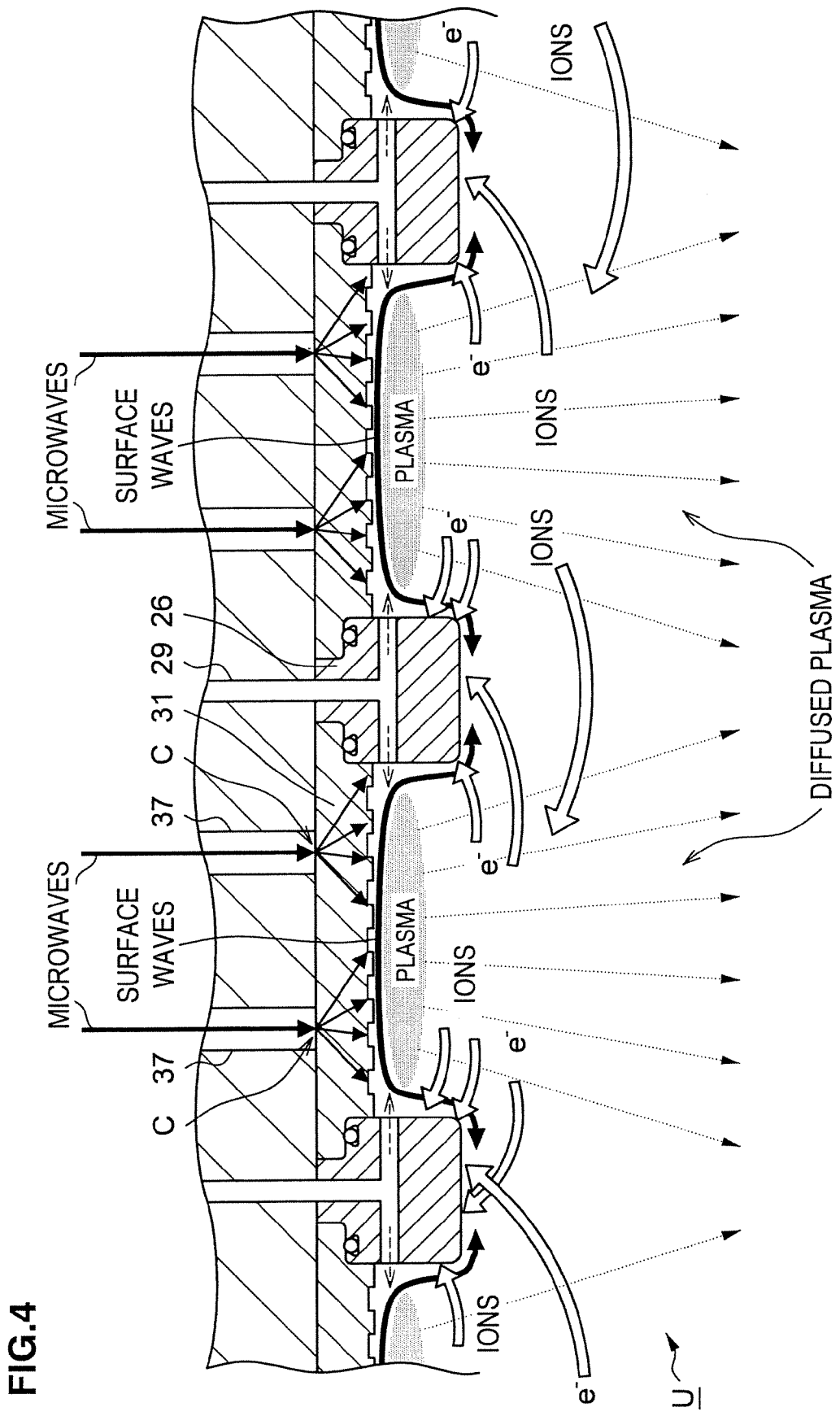
FIG. 4 illustrates to an explanation that interference to the plasma in a plasma processing apparatus with projecting beams.
Figure 7:
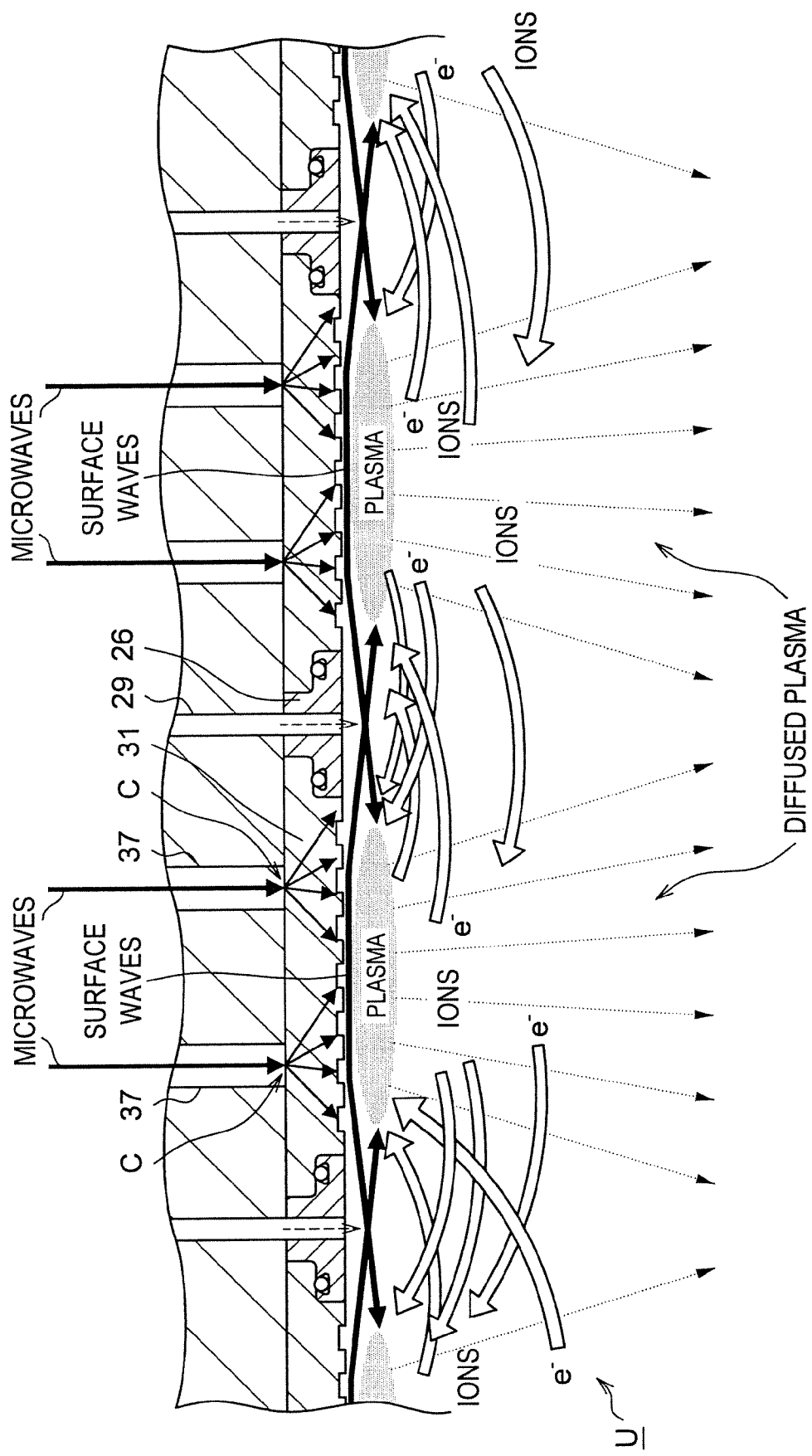
FIG. 7 illustrates to an explanation that interference to the plasma in a plasma processing apparatus in which the heights of the dielectric member and the beams are same grade level each other.

Next, in reference to FIGS. 4 and 7, the factors that may cause mode jump in the plasma generated near the lower surface of each dielectric part 31 in the microwave plasma processing apparatus 100 described above are explained. Then, how the inventors succeeded in generating uniform plasma in a stable manner by effectively inhibiting mode jumps in the microwave plasma processing apparatus 100 in the embodiment is explained.

FIGS. 4 and 7 each present a schematic illustration of the area near the dielectric member with FIG. 4 showing a structure that includes the beams 26, which support the dielectric parts 31, made to project out and FIG. 7 showing the beams 26 supporting the dielectric parts 31 set flush without projecting out. It is to be noted that in the state illustrated in FIGS. 4 and 7, the lower-stage gas pipes 28 are not yet mounted and accordingly, gas is introduced through the gas supply pipes 29 passing through the beams 26.

First, the three factors that may cause mode jumps in the plasma generated near the lower surface of each dielectric part 31 are explained in reference to FIG. 7.

(First Factor: Microwaves)

As shown in FIG. 2, the microwaves emitted from the microwave generators 40 are propagated through the rectangular waveguides 33 and pass through the individual slots 37. During this process, the amplitude of the advancing waves being propagated through the rectangular waveguides 33 and the amplitude of reflected waves occurring as the advancing waves are reflected at the end surfaces of the rectangular waveguides 33 changes constantly over time. As a result, the amplitude of standing waves in the rectangular waveguides 33, which are combined waves constituted with the advancing waves and the reflected waves, also changes constantly. Due to this change in the standing wave amplitude, the intensity of the electrical field energy of the microwaves passing through the individual slots 37 fluctuates constantly.

In addition, the impedance in the plasma changes as the electrical field energy of the microwaves fluctuates as described above. The change of impedance in the plasma alters the ratio of the electrical field energy that is absorbed in the plasma and the electrical field energy that reflects the plasma while the surface waves generated by the electrical field energy having been transmitted through the dielectric parts 31, reflected and propagated between the dielectric parts 31 and the plasma.

Figure 10:
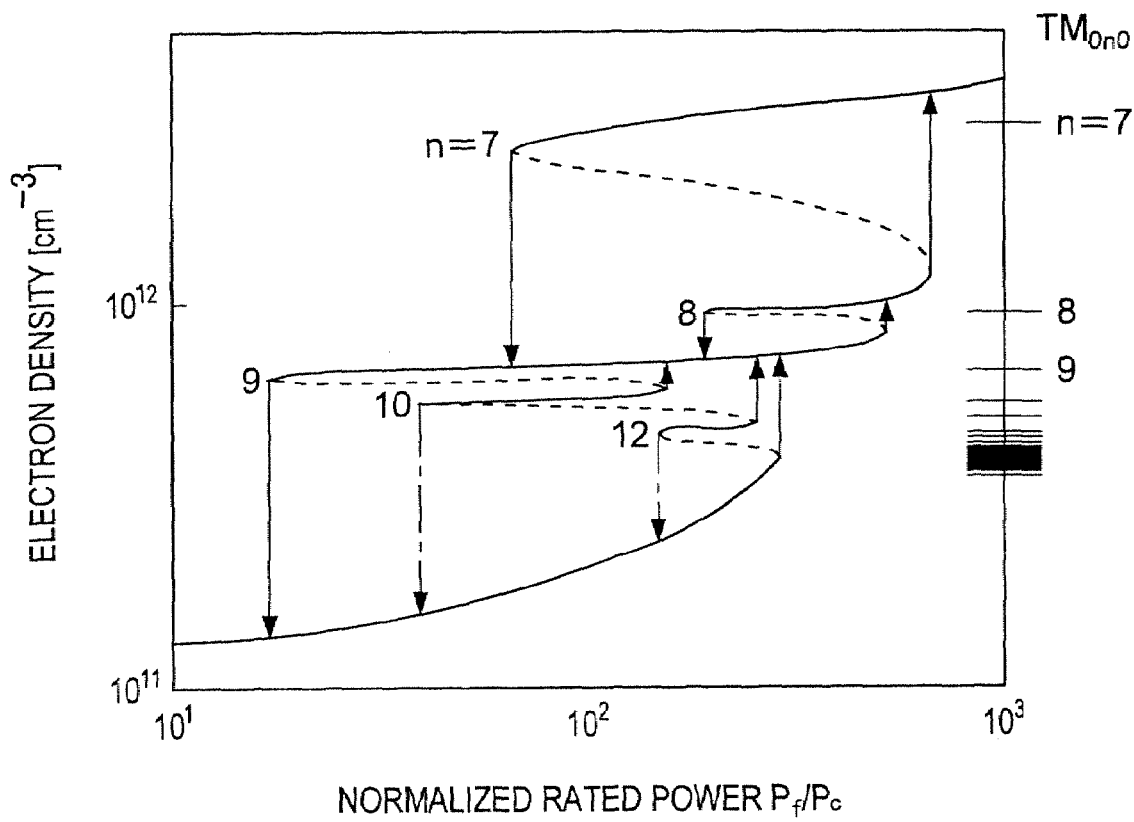
FIG. 10 shows the relationship between the power of the microwaves and the electron density and the surface wave mode.

Depending upon the specific processing conditions that have been selected, mode jumps may occur when the electrical field energy of the incoming microwaves changes or the impedance in the plasma changes as described above. More specifically, if the power of the incoming microwaves changes when generating plasma through microwave discharge, a surface wave assuming an inherent mode (TMono mode) becomes discontinously excited near the lower surface of the dielectric member depending upon the extent of the change in the power level or depending upon the processing conditions, as shown in FIG. 10. When the surface wave in the inherent mode is excited discontinuously as described above, the distribution of the electromagnetic field intensity under the dielectric member becomes completely different from the initial distribution, which leads to discontinous changes in the plasma electron density generated under the dielectric member and ultimately to plasma electron density jumps (mode jumps). It is to be noted that in FIG. 10, Pf represents the normalized rated power and Pc represents a constant that is dependent on the processing conditions.

The surface wave mode jumps are a phenomenon unique to microwave plasma processing apparatuses, and is not observed in inductively-coupled plasma processing apparatuses or capacitively-coupled plasma processing apparatuses. In other words, plasma mode jumps tend to occur more readily in a microwave plasma processing apparatus than in an inductively-coupled plasma processing apparatus or in a capacitively-coupled plasma processing apparatus. In addition, if the dielectric parts 31 and the beams 26 are formed so as to lie flush with one another as shown in FIG. 7, the following two factors may readily cause interference in the plasma generated under a given dielectric part by the plasma generated under another dielectric part.

(Second Factor: Interference Attributable to Surface Waves)

The surface waves cause interference in the plasma. As shown in FIG. 7, the electromagnetic field of the incoming microwaves spreads inside the dielectric member evenly and radially from the openings C (slot openings), is transmitted to the lower surfaces of the individual dielectric parts and generates surface waves at the lower surfaces of the dielectric parts.

As the surface waves thus generated are reflected between the dielectric parts 31 and the plasma while they are being propagated, part of the electrical field energy is used as evanescent waves for plasma generation. However, if there is no stage formed between each dielectric part 31 and the beam 26 to create a barrier, the surface waves are propagated to the adjacent dielectric parts since only a small quantity of the electrical field energy is used for plasma generation.

As the surface waves are propagated to the adjacent dielectric parts 31, as described above, the interference induced by the surface waves amplifies the extent of the change in the densities of the plasma generated under the adjacent dielectric parts, thereby destabilizing the states of the plasma generated under the adjacent dielectric parts 31. Mode jumps in the plasma generated under the individual dielectric parts 31 thus occur.

(Third Factor: Interference by Electrons and Ions)

Another factor that causes interference is electrons and ions in the diffused plasma that are propagated through the plasma. For instance, as the plasma is diffused, some of the electrons and the ions in the plasma are propagated through the plasma to reach the plasma having been generated in the space under the adjacent dielectric parts. The arrival of the electrons and the ions at the plasma generated under the adjacent dielectric parts causes the electron densities and the ion densities in the plasma generated under the adjacent dielectric parts to fluctuate. In other words, these electrons and ions constitute the third factor that causes mode jumps in the plasma generated under the individual dielectric parts 31.

As explained above, plasma mode jumps occur due to discontinous fluctuations in the plasma electron density under each dielectric part 31, which manifests as the end result of a complex combination of the fluctuations of the electrical field energy of the incoming microwaves and the resulting change in the impedance in the plasma (first factor), the interference attributable to the surface waves (second factor) and the interference attributable to the diffused plasma (third factor).

If these mode jumps occur frequently during plasma generation and the state of the plasma changes discontinously each time a mode jump occurs, the extent of gas dissociation changes and the quality of the film being formed, too, changes each time a mode jump occurs. Thus, layers of non-uniform films are formed.

The inventors addressed the issue by allowing the beams 26 to project out from the ceiling of the processing container 10 so as to inhibit plasma mode jumps. The following is an explanation given in reference to FIG. 4 on how the inventors inhibited plasma mode jumps.

(Control of the Second Factor (Interference by Surface Wave))

Projecting beams 26 separating the individual dielectric parts 31 from one another form protective walls for protecting the plasma generated under the dielectric parts 31 from external interference. As explained earlier, when surface waves generated with the electrical field energy of the microwaves having been transmitted through the dielectric parts 31 are propagated toward the adjacent dielectric parts 31 as they are reflected between the surfaces of the dielectric parts 31 and the beams 26 and the plasma, part of the electrical field energy in the surface waves is used as evanescent waves for plasma generation. Generally speaking, as long as no energy is supplied from the outside, the electrical field energy in the surface waves absorbed and used in the plasma increases in direct proportion to the distance over which the surface waves are propagated.

Beams 26 constituted of a nonmagnetic and electrically conductive material do not allow microwaves to be transmitted. In such a case, no additional electrical field energy can be received as the surface waves are propagated over the surfaces of the beams 26. If stage is created between the dielectric parts and the beams 26 the distance over which the surface waves are propagated to the plasma generated under the adjacent dielectric parts 31 is extended by an extent corresponding to the portions of the beams 26 constituting their sidewalls, compared to the distance that would be measured in a structure in which the dielectric parts 31 and the beams 26 are set same level, and furthermore, no electrical field energy can be applied to the surface waves being propagated over the beams 26. For these reasons, a great deal of electrical field energy is consumed while the surface wave is propagated toward the adjacent dielectric part and the surface wave becomes attenuated before it reaches the lower portions of the adjacent dielectric parts. Thereby, the extent of change in the plasma electron density in the plasma generated under the adjacent dielectric part does not become amplified.

(Control of Third Factor (Interference by Diffused Plasma))

In addition, as the area of the surfaces of the beam walls increases by allowing the beams 26 to project out, the electrons and the ions to collide with the wall surfaces increase exponentially (the coefficients of electron diffusion and ion diffusion can be each expressed as an exponential function) and, as a result, the numbers of electrons and ions propagated to the plasma generated under the adjacent dielectric parts decrease. Consequently the extent of change in the plasma electron density in the plasma generated under the adjacent dielectric part does not become amplified.

As explained above, the microwave plasma processing apparatus 100 achieved in the present embodiment generates uniform plasma in a stable manner by effectively inhibiting interference in the plasma generated under the adjacent dielectric parts attributable to surface waves and interference in the plasma generated under the adjacent dielectric parts attributable to diffused plasma and thus by ultimately inhibiting plasma mode jumps.

(Test Results)

The inventors designed the microwave plasma processing apparatus 100 with projecting beams 26 as achieved in the embodiment and executed a gate oxide film forming process on this microwave plasma processing apparatus so as to prove the efficacy of the concept and the logic described above. The processing conditions selected for the test operation were; the pressure in the processing chamber U set to 60 mTorr (7.98 Pa) and the microwave power set to 2.55 kW×3 (three microwave generators 40 were utilized). It is to be noted that the glass, substrate may measure 730 mm×920 mm or more, and the present test may be adopted in conjunction with glass substrates measuring 730 mm×920 mm in the G4.5 substrate size (the inner diameter of the chamber: 1000 mm×1190 mm) and 1100 mm×1300 mm in the G5 substrate size (the inner diameter of the chamber: 1470 mm×1590 mm), for instance.

Oxygen gas, silane gas and argon gas were used as the processing gas constituents, with the flow rate for the oxygen gas set to 833 sccm, the flow rate for the silane gas set to 100 sccm and the flow rate for the argon gas set to 1500 sccm. In addition, the temperature at the susceptor 11 (stage) was sustained at 300° C. so as to keep the temperature in the processing chamber U at 120° C. As explained earlier, the oxygen gas was introduced through the gas supply holes A disposed at the upper stage, whereas the silane gas and the argon gas were introduced through the gas supply holes B at the gas showerhead (gas pipes 28) disposed at the lower stage.

While emission of very bright light, which appeared to be a manifestation of mode jump, was visually observed at a plurality of positions at the lower surfaces of the beams 26 in a microwave plasma processing apparatus in which the dielectric parts 31 and the beams 26 were set flush with one another, hardly any light emission was observed at the surfaces of the beams 26 in the microwave plasma processing apparatus 100 in the present embodiment with the projecting beams 26.

Since such light emission occurs when electrons in an excited state revert to the normal state, it is considered that the electron density distribution did not remain consistent over the areas where light was emitted and over areas where no light was emitted. As hardly any light emission was observed during the process in the microwave plasma processing apparatus 100 with the projecting beams 26, it can be assumed that the electron density distribution remained uniform over the areas near the dielectric parts 31 and thus uniform plasma was generated in a stable manner with no mode jumps manifesting.

In order to present these findings in the form of objective numerical values, the inventors conducted C-V measurement of gate oxide films formed through gate oxide film forming processes executed in microwave plasma processing apparatuses with the heights of the beams 26 (the extents by which the beams project out beyond the dielectric member) of the beams 26 set to 0 mm, 10 mm and 20 mm by utilizing a film evaluation device (a mercury probe manufactured by SSM (Solid-State Measurement Inc.)). The results of the measurement are presented in FIGS. 5 and 6.

Figures 5, 6:
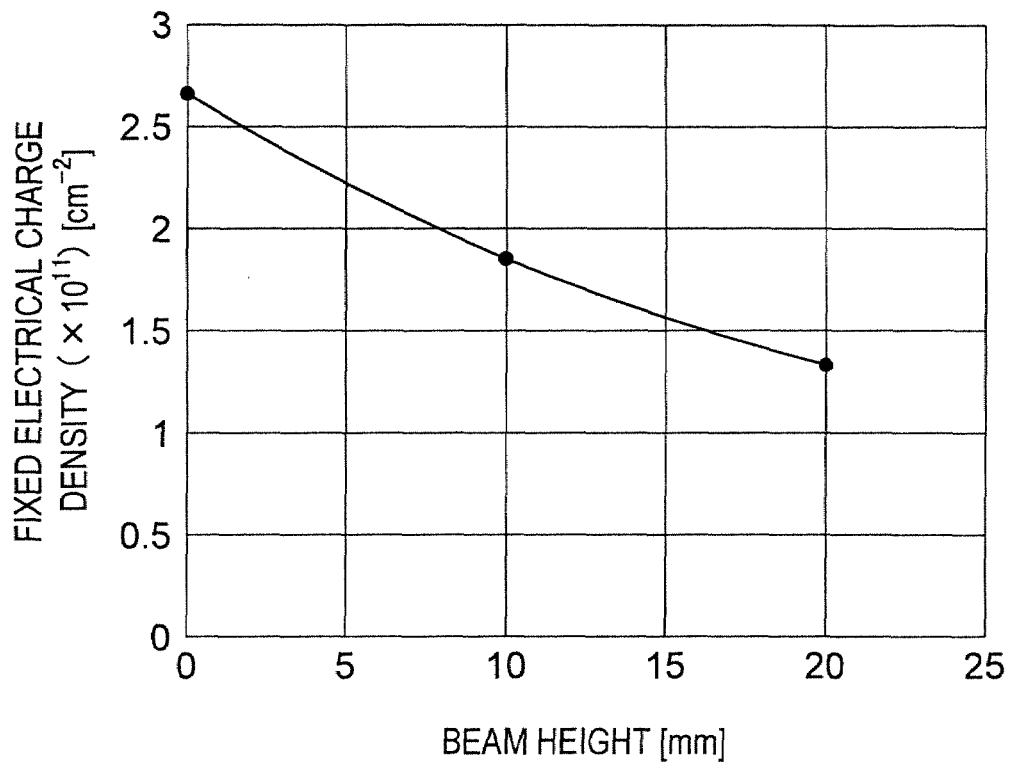
FIG. 5 presents a graph indicating the beam height dependency of the fixed electrical charge density in the embodiment.
FIG. 6 shows the relationship among the beam height, the fixed electrical charge density and the visually measured extent of light emission in the embodiment.

As the measurement results presented in FIG. 5 indicate, the value of the fixed electrical charge density took on a smaller value as the beam height increased. In addition, as indicated in FIG. 6, when the beam height was 0 mm, the fixed electrical charge density was 2.7 cm$^{-2}$ and light emission was observed visually "O (light emission observed)", when the beam height was 10 mm, the fixed electrical charge density was 1.8 cm$^{-2}$ and no light emission was visually observed "X (no light emission observed)" and when the beam height was 20 mm, the fixed electrical charge density was 1.3 cm$^{-2}$ and no light emission was visually observed "X (no light emission observed)".

The fixed electrical charge density can be used as an index indicating whether or not a good quality film was formed. More specifically, the smaller the fixed electrical charge density, the better the quality of the gate oxide film having been formed. Thus, the measurement results described above prove that a better quality gate oxide film can be formed by increasing the beam height.

(Upper Limit Value for Beam Projection)

The height h of the beams 26 must be set by ensuring that the plasma electron density Ne around the ends of the beams 26 is equal to or greater than the plasma cutoff electron density Nc (see FIG. 3). Accordingly, the height of the beams 26 assumes its upper limit value he when the plasma electron density Ne around the ends of the beams 26 is equal to the cutoff density Nc. More specifically, the upper limit value he for the height of the beams 26 can be calculated as hc=$2^{1/2}$×a×(1nNo−1nNc)/2π with No (see FIG. 3) representing the plasma electron density around the ends of the beams 26 directly under the dielectric member and a representing the minimum value that can be assumed for the intervals between the adjacent beams.

The surface wave generated with the electrical field energy at the lower surface of each dielectric part 31 is propagated as it is reflected between the surfaces of the dielectric parts and the beam and the plasma. During this process, part of the electrical field energy in the surface wave is used as an evanescent wave in the plasma generation. Since no energy is supplied from the outside while the microwaves are propagated at the metal beams, the electrical field energy in the surface wave is continuously used up for plasma generation and, as a result, the surface wave becomes attenuated.

As the surface wave becomes attenuated as described above and the plasma electron density Ne near the beam ends become equal to or smaller than the cutoff plasma electron density Nc, it is no longer possible to sustain a state in which the surface wave (microwave) propagating over the beams penetrates the plasma as an evanescent wave due to the lowered electron density around the beam ends and instead the surface wave advances into the plasma rapidly. As a result, the plasma inside the processing container becomes destabilized.

This means that the height h of the beams 26 must be selected by ensuring that the plasma electron density Ne around the ends of the beams 26 is greater than the cutoff plasma electron density Nc. As long as the height h satisfies this requirement, the plasma electron density near the ends of the beams 26 is sustained at a specific level. Thus, the surface waves (microwaves) propagated over the beams 26 are continuously allowed to penetrate into the plasma as evanescent waves. As a result, the substrate G can be processed accurately with the uniformly generated plasma.

(Simulation Results)

Figure 8:
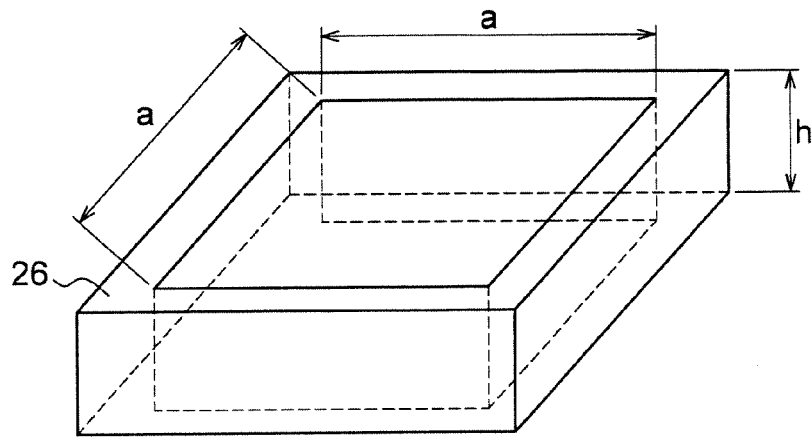
FIG. 8 shows a simulation model used to determine the upper limit value for the beam height in the embodiment.

Upon drawing to the logical conclusion described above, the inventors executed the following simulation in order to determine the upper limit value he for the height of the beams 26. As indicated in FIG. 8, a represents the minimum value assumed for the intervals between the adjacent beams and h represents the height of the beams 26 in this simulation model.

The plasma electron density Nh around the beams projecting out over the height h can be expressed as in (1) below in an approximation model.

$$Nh=No \times \exp\{-2\pi h/(2^{1/2} \times a)\} \quad (1)$$

By modifying expression (1) above, the following logarithmic function is obtained $$h=2^{1/2} \times a \times (1nNo-1nNh)/2\pi \quad (2)$$

Figure 9:
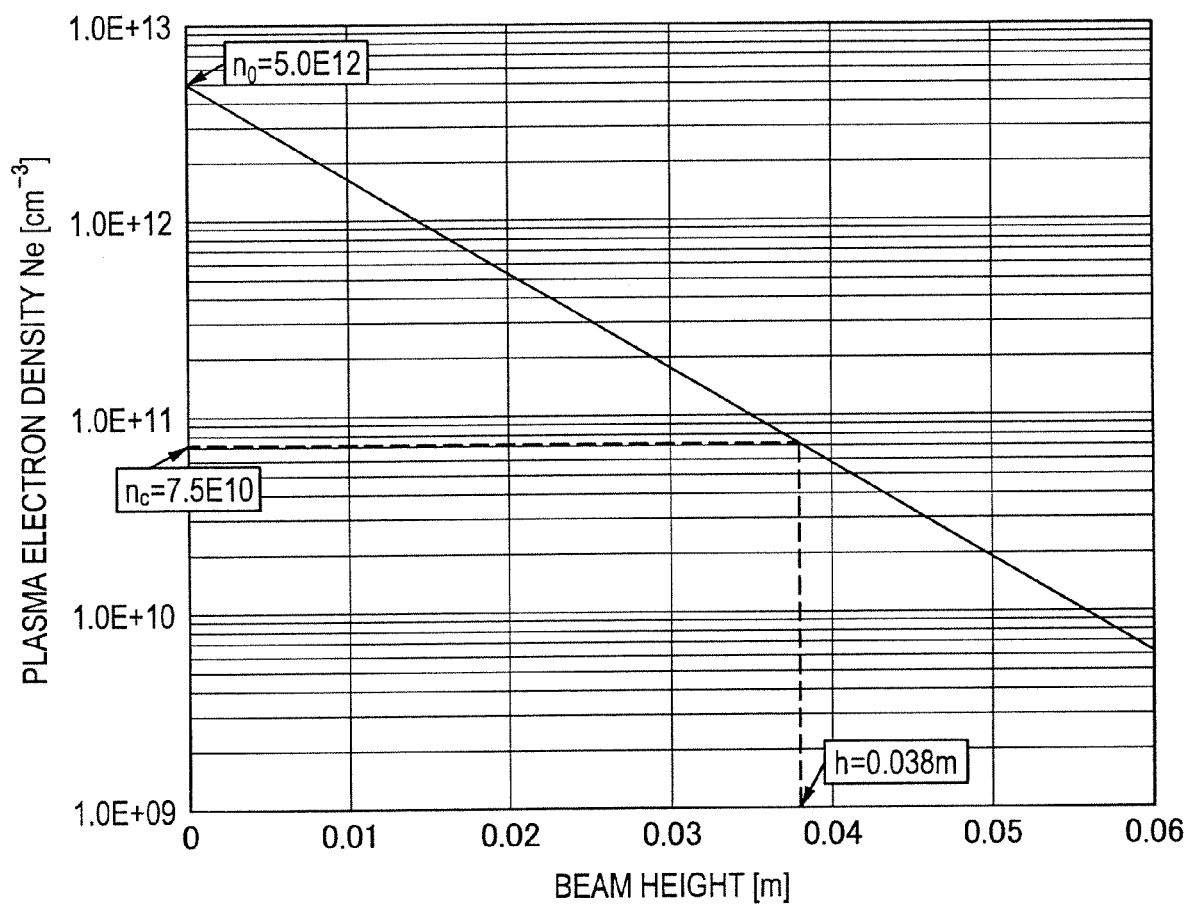
FIG. 9 shows the relationship between the beam height and the plasma electron density in the embodiment.

The function expressed in (2) above is graphed in FIG. 9. FIG. 9 shows a logarithmic graph with the height h of the beams 26 indicated along the horizontal axis and the plasma electron density Ne indicated along the vertical axis.

According to the theory presented earlier, the height h of the beams 26 must be set by ensuring that a condition expressed as Nh>Nc is satisfied, in order to sustain stability in the plasma state. Accordingly, the height h of the beams 26 takes on its upper limit value he when Nh=Nc. The following expression (3) is obtained by substituting he for h in expression (2) above.

$$hc=2^{1/2} \times a \times (1nNo-1nNc)/2\pi \quad (3)$$

The cutoff plasma electron density Nc is normally expressed as in (4) below.

$$Nc=m\epsilon \times \epsilon o \times \omega^2/e^2 \quad (4)$$

me, ϵo, ω and e in the expression above respectively represent the mass of the electrons, the dielectric constant of the vacuum, the angular frequency of the incoming waves and the electron charge.

The cutoff plasma electron density Nc is calculated to be $7.5 \times e^{10}$ (cm$^{-3}$) by using expression (4) above. By using the calculation results Nc and the plasma electron density No=$5.0 \times e^{12}$ (cm$^{-3}$) around the ends of the beams directly under the dielectric member for substitution in expression (3), the inventors confirmed that the upper limit value hc of the height of the beams 26 was "0.038 m". The results of the simulation are presented in FIG. 9.

As long as the height h of the beams 26 is equal to or less than 0.038 m, the plasma electron density Nh near the ends of the beams 26 can be sustained at a certain level. This, in turn, makes it possible to sustain a state in which surface waves (microwaves) propagated over the beams 26 can penetrate into the plasma as evanescent waves. In short, it was proved that as long as the height h of the beams 26 is equal to or less than 0.038 m, the surface waves (microwaves) propagated over the beams 26 are allowed to penetrate into the plasma as evanescent waves and thus, an unpreferable phenomenon of the surface waves entering the plasma rapidly destabilizing the plasma inside the processing container can be inhibited.

As described above, in the microwave plasma processing apparatus 100 achieved in the embodiment with its beams 26 made to project further out relative to the dielectric parts 31, interference attributable to surface waves and interference attributable to diffused plasma are effectively inhibited and thus, plasma mode jumps are inhibited. Consequently, uniform plasma can be generated in a stable manner and the substrate G can be plasma-processed with a high level of accuracy.

It is to be noted that in the microwave plasma processing apparatus 100 achieved in the embodiment, the oxygen gas is introduced through the upper level gas supply holes A and the silane gas and the argon gas are introduced through the lower level gas supply holes B. However, the gas supply holes may assume positions other than those and the various types of gases may be introduced through specific supply holes among a plurality of supply holes formed at positions assuming equal heights to one another.

In addition, the second gas may be introduced through a plurality of nozzles made to project out from the beams 26 like icicles, instead of the plurality of gas pipes 28 shown in FIG. 3.

Inside the processing chamber U, a uniform film is formed without significantly damaging the substrate G by using a plasma with a low electron temperature of, for instance, 0.7 eV~2.0 eV and high density of $10^{11}$~$10^{12}$ cm$^{-3}$. When forming an amorphous silicon film, for instance, it is preferable to set the pressure inside the processing chamber U to 5~100 Pa and more preferably to 10~60 Pa and to sustain the temperature of the substrate G at 200~450° C. and more preferably at 250~380° C. In addition, the processing chamber U should assume measurements equal to or greater than G3, e.g., G4.5 (the dimensions of the substrate G: 730 mm×920 mm, the inner dimensions of the processing chamber U: 1000 mm×1190 mm), or G5 (the dimensions of the substrate G: 1100 mm×1300 mm, the inner dimensions of the processing chamber U: 1470 mm×1590 mm). While the power output from the microwave generators should be in the range of 1~8 W/cm$^2$, it is particularly preferable to set the output within a range of 2.2 W/cm$^2$ to 3 W/cm$^2$. As long as the power output from the microwave generators is equal to or greater than 1 W/cm$^2$, plasma ignition occurs and plasma can be generated with relative stability. If, on the other hand, the power output from microwave generators is less than 1 W/cm$^2$, plasma ignition does not occur reliably and thus, the plasma generation is greatly destabilized, and since the process itself becomes destabilized and less consistent under these circumstances, such a power output setting is not suited for practical applications.

The operations of the individual units, executed in the embodiment as described above, are correlated and thus, they may be regarded as a series of operations by bearing in mind how they relate to one another. By considering them as a sequence of operations, the embodiment of the plasma processing apparatus according to the present invention can be remodeled as an embodiment of a plasma processing method.

While the invention has been particularly shown and described with respect to a preferred embodiment thereof by referring to the attached drawings, the present invention is not limited to this example and it will be understood by those skilled in the art that various changes in form and detail may be made therein without departing from the spirit, scope and teaching of the invention.

For instance, the plasma processing executed in the plasma processing apparatus according to the present invention does not need to be CVD processing, and the plasma processing apparatus according to the present invention may execute all types of plasma processing including ashing and etching.

The present invention may be adopted in a new and improved plasma processing apparatus with which plasma mode jumps can be inhibited.

What is claimed is:

1. A plasma processing apparatus comprising:
   a plurality of waveguides each having a plurality of slots;
   a dielectric member through which microwaves propagated via the plurality of waveguides and via the plurality of slots are transmitted; and
   a processing chamber in which a gas is raised to plasma by the microwaves transmitted through the dielectric member and a subject to be processed is processed with the plasma, wherein:
   the dielectric member is constituted with a plurality of dielectric parts that are supported by a beam, each of the plurality of dielectric parts transmitting the microwaves propagated through one or more of the plurality of waveguides and passed thereto via one or more slots in each of the waveguides; and wherein
   the beam projects from the bottom surface of the dielectric parts toward the subject to be processed to the extent that an electron density Ne of the plasma in the vicinity of an edge of the projected beam becomes equal to or greater than a cutoff electron density Nc of the plasma,
   wherein an upper limit value hc of a projected position of beam is calculated as:
   hc=$2^{1/2} \times a \times (1nNo-1nNc)/2\pi$, with "No" representing the plasma electron density near the dielectric parts and "a" representing the smallest value of the interval between adjacent beams.

2. The plasma processing apparatus according to claim 1, wherein:
   the upper limit value hc of the beams is 0.038 m.

3. The plasma processing apparatus according to claim 1, wherein:
   the each of the plurality of dielectric parts is supported by the beam over peripheral edges of the each dielectric part.

4. The plasma processing apparatus according to claim 1, wherein:

at least any one of a recessed portion and a projecting portion is formed at a surface of the each of the plurality of the dielectric parts, which surface faces the subject to be processed.

5. The plasma processing apparatus according to claim 1, wherein:
the beam is constituted of an electrically conductive material.

6. The plasma processing apparatus according to claim 5, wherein:
the beam is constituted of a non-magnetic material.

7. The plasma processing apparatus according to claim 1, further comprising:
a first gas supply unit that supplies a first gas through first gas supply holes; and
a second gas supply unit that supplies a second gas through second gas supply holes formed further toward the subject to be processed than the first gas supply holes, wherein:
the beam is disposed further toward the dielectric member than the second gas supply holes.

8. The plasma processing apparatus according to claim 7, wherein:
at least any one of the first gas and the second gas is a mixed gas containing a plurality of gas constituents; and
the first gas and the second gas have a relationship whereby a binding energy of the first gas is greater than a binding energy of the second gas.

9. The plasma processing apparatus according to claim 8, wherein:
the first gas and the second gas have the relationship unless the mixed gas induces an excessive reaction.

10. A plasma processing method to be adopted in a plasma processing apparatus comprising:
propagating microwaves through one or more waveguides of a plurality of waveguides;
passing the microwaves through one or more slots of a plurality of slots at each waveguide;
transmitting the microwaves through a plurality of dielectric parts supported by a beam formed to project from the bottom surface of the dielectric parts toward the subject to be processed to the extent that an electron density Ne of the plasma in the vicinity of an edge of the projected beam becomes equal to or greater than a cutoff electron density Nc of the plasma; and
processing the subject to be processed with plasma generated by raising a gas with the transmitted microwaves,
wherein an upper limit value hc of a projected position of beam is calculated as:
$hc = 2^{1/2} \times a \times (lnNo^{31} lnNc)/2\pi$, with "No" representing the plasma electron density near the dielectric parts and "a" representing the smallest value of the interval between adjacent beams.

11. The plasma processing method according to claim 10, wherein:
the upper limit value hc of the beams is 0.038 m.

12. The plasma processing method according to claim 10, further comprising:
introducing a first gas through first gas supply holes; and
introducing a second gas through second gas supply holes formed further toward the subject to be processed than the first gas supply holes and the projected position of the beam after plasma ignition of the introduced first gas.

13. The plasma processing method according to claim 12, wherein:
at least any one of the first gas and the second gas is a mixed gas containing a plurality of gas constituents; and
the first gas and the second gas have a relationship whereby a binding energy of the first gas is greater than a binding energy of the second gas.

14. The plasma processing method according to claim 13, wherein:
the first gas and the second gas have the relationship unless the mixed gas induces an excessive reaction.

* * * * *